United States Patent
Kasai et al.

(10) Patent No.: US 11,098,170 B2
(45) Date of Patent: *Aug. 24, 2021

(54) FILM AND METHOD FOR ITS PRODUCTION

(71) Applicant: AGC Inc., Chiyoda-ku (JP)

(72) Inventors: Wataru Kasai, Chiyoda-ku (JP); Masami Suzuki, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 65 days.

This patent is subject to a terminal disclaimer.

(21) Appl. No.: 16/191,799

(22) Filed: Nov. 15, 2018

(65) Prior Publication Data

US 2019/0085142 A1    Mar. 21, 2019

Related U.S. Application Data

(63) Continuation of application No. PCT/JP2017/024238, filed on Jun. 30, 2017.

(30) Foreign Application Priority Data

Jul. 4, 2016 (JP) ............................. JP2016-132443

(51) Int. Cl.
*C08J 5/18* (2006.01)
*C08L 27/18* (2006.01)
(Continued)

(52) U.S. Cl.
CPC ................. *C08J 5/18* (2013.01); *B29C 48/08* (2019.02); *B29C 48/305* (2019.02); *C08L 23/20* (2013.01);
(Continued)

(58) Field of Classification Search
CPC ...... C08J 5/18; C08J 2327/20; C08J 2327/18; C08J 2327/14; C08J 2323/08;
(Continued)

(56) References Cited

U.S. PATENT DOCUMENTS

2001/0027236 A1    10/2001    Abusleme et al.
2003/0138580 A1    7/2003    Blong
(Continued)

FOREIGN PATENT DOCUMENTS

CN    1497013 A    5/2004
CN    105705308 A    6/2016
(Continued)

OTHER PUBLICATIONS

International Search Report dated Sep. 12, 2017 in PCT/JP2017/024238, filed on Jun. 30, 2017 (with English Translation).

*Primary Examiner* — Peter A Salamon
(74) *Attorney, Agent, or Firm* — Oblon, McClelland, Maier & Neustadt, L.L.P.

(57) ABSTRACT

To provide a film excellent in breakage resistance and uniform stretchability, and a method for its production. The film is a single-layer film characterized in that it is made of a blend resin of two kinds of resins both belonging to any one of ETFE, PFA, FEP, ECTFE and PMP, wherein the melt flow rate of the film is at least 6 g/10 min. and less than 20 g/10 min., and α of the film as measured by a prescribed measurement method is at least 0.99.

10 Claims, 2 Drawing Sheets

(51) Int. Cl.
*C08L 23/20* (2006.01)
*B29C 48/305* (2019.01)
*B29C 48/08* (2019.01)
*H01L 21/56* (2006.01)
*H01L 23/10* (2006.01)
*H01L 23/29* (2006.01)

(52) U.S. Cl.
CPC ............ C08L 27/18 (2013.01); H01L 21/561 (2013.01); H01L 21/566 (2013.01); H01L 23/10 (2013.01); H01L 23/293 (2013.01); *C08J 2323/08* (2013.01); *C08J 2327/14* (2013.01); *C08J 2327/18* (2013.01); *C08J 2327/20* (2013.01)

(58) Field of Classification Search
CPC .......... C08L 23/20; C08L 27/18; B29C 48/30; B29C 48/305; H01L 23/10; H01L 23/293; H01L 21/561; H01L 21/566
See application file for complete search history.

(56) References Cited

U.S. PATENT DOCUMENTS

| | | | |
|---|---|---|---|
| 2004/0116606 A1 | 7/2004 | Sumi et al. | |
| 2010/0218975 A1* | 9/2010 | Mehan | H01B 7/0225 174/120 SR |
| 2014/0342111 A1 | 11/2014 | Tanaka et al. | |
| 2015/0345670 A1* | 12/2015 | Proof | F16L 11/127 138/137 |
| 2016/0090430 A1* | 3/2016 | Sbriglia | B29C 43/24 264/146 |
| 2016/0189985 A1* | 6/2016 | Kasai | H01L 21/566 438/127 |
| 2019/0085107 A1* | 3/2019 | Kasai et al. | C08J 5/18 |

FOREIGN PATENT DOCUMENTS

| | | |
|---|---|---|
| JP | 2001-270969 | 10/2001 |
| JP | 2002-110722 | 4/2002 |
| JP | 2005-47132 | 2/2005 |
| JP | 2005-307059 | 11/2005 |
| JP | 2012-207195 | 10/2012 |
| JP | 2013-147026 | 8/2013 |
| JP | 2014-40606 | 3/2014 |
| JP | 2014-213493 | 11/2014 |
| JP | 2015-52123 | 3/2015 |
| JP | 2017-119741 | 7/2017 |
| TW | 201335264 A1 | 9/2013 |
| WO | WO 2015/095746 A1 | 6/2015 |

* cited by examiner

FILM AND METHOD FOR ITS PRODUCTION

TECHNICAL FIELD

The present invention relates to a film and a method for its production.

BACKGROUND ART

A semiconductor chip is usually accommodated (sealed) in a container called a package for the purpose of blocking and protection from outside air, and is mounted on a substrate, as a semiconductor device. For the package, a curable resin such as an epoxy resin is used.

As a method for producing a semiconductor device, for example, a method by a so-called transfer molding method or compression molding method is known wherein a substrate having a semiconductor chip or the like mounted thereon, is disposed so as to be positioned at a predetermined location in a mold and a curable resin is filled in the mold and cured. Further, in order to improve the productivity, a plurality of semiconductor chips may be mounted on a substrate, they may be collectively sealed with a curable resin, and then the package and substrate may be cut so that the plurality of semiconductor chips may be separated and singulated.

In the above transfer molding method or compression molding method, in order to facilitate release of the package from the mold, a release film may be placed on the surface of the mold to be in contact with the curable resin. At the time of sealing, the release film will be elongated by vacuum suction, etc., to follow the mold, and therefore, the release film is usually required to have releasability and mold followability.

As release films, for example, the following ones have been proposed.

(1) A release film obtainable from a resin composition containing from 0.01 to 10 parts by mass of a 4-methyl-1-pentene polymer having a predetermined intrinsic viscosity and melting point, to 100 parts by mass of at least one resin selected from the group consisting of thermoplastic resins and thermosetting resins (Patent Document 1).

(2) A release film obtained by irradiating ionizing radiation to a film made solely of a polyurethane type elastomer having a JIS A hardness of at least 70 and a Vicat softening temperature of from 100 to 180° C. or made of a thermoplastic elastomer composition composed mainly of the polyurethane type elastomer (Patent Document 2).

(3) A release film containing a polyester resin layer containing a polybutylene terephthalate, disposed at least on one outer-most surface layer, wherein the polyester resin layer has a predetermined crystallinity, and the maximum absorption peak intensity Pa in a region of from 2,910 cm$^{-1}$ to 2,930 cm$^{-1}$ and the maximum absorption peak intensity Pb in a region of from 2,950 cm$^{-1}$ to 2,970 cm$^{-1}$, to be measured by ATR method, will satisfy a predetermined relationship (Patent Document 3).

(4) A release film comprising a fluorinated resin, wherein the difference between the stress in the longitudinal direction and the stress in the width direction of the film as measured under predetermined conditions, is at most 1.80 MPa (Patent Document 4).

In recent years, in order to improve the productivity, the area (sealing area) to be sealed at one time by a mold tends to be large. For example, as the size of a substrate having semiconductor chips mounted thereon and disposed in a mold, heretofore 200 mm×70 mm or the like was common, but in recent years, in the case of a square shape, 200 mm×200 mm, and in the case of a circular shape, 12 inches (30.48 cm) in diameter, have come to be adopted.

PRIOR ART DOCUMENTS

Patent Documents

Patent Document 1: JP-A-2014-40606
Patent Document 2: JP-A-2012-207195
Patent Document 3: JP-A-2014-213493
Patent Document 4: JP-A-2013-147026

DISCLOSURE OF INVENTION

Technical Problem

At the time of sealing with a curable resin, a load may sometimes be locally exerted on the release film. For example, in transfer molding, it is necessary to let the curable resin flow faster so that the curable resin will not be cured during its flow, and as a result, at corners of the mold cavity, a large impact will be exerted on the release film.

The present inventors have found that the above release films of (1) to (3) have such a problem that the portion at which such a load is exerted, will be locally stretched or broken. When the release film is locally stretched, a difference in thickness will be formed in the release film. If there is a difference in thickness locally in the release film, that difference will be transferred to a package so that the thickness of the package becomes thick locally to cause non-uniformity in internal stress, etc. and thus is likely to present a damage to semiconductor chips, etc. inside of the package. Especially, at corners of the sealing portion, the film tends to be strongly stretched, and the film tends to become thin, whereby the package tends to be thick correspondingly. Since only the corner portion becomes to be slightly higher and to have a bulged shape, such corner portion is referred to as a "horn", and the higher the horn, the higher the risk to present a damage to the package.

The release film of (4) is said to be free from unevenness in thickness due to uneven elongation when it is stretched at the time of molding by a mold, but the present inventors have found that the effect cannot be said to be sufficient.

As described above, as a release film, a film is required to have breakage resistance such that it is unbreakable even if it is largely stretched by a load locally exerted e.g. in such a case that the sealing area is large, and uniform stretchability such that at the time of being stretched, it is entirely uniformly elongated and the thickness is less likely to be non-uniform, even if a strong load is locally exerted.

It is an object of the present invention to provide a film excellent in breakage resistance and uniform stretchability, and a method for its production.

Solution to Problem

The present invention provides a film and a method for its production, having constructions of the following [1] to [11].
[1] A film being a single layer film, characterized in that it is made of a blend resin of two kinds of resins both belonging to any one of the following ETFE, PFA, FEP, ECTFE and PMP,
the melt flow rate of the film to be measured by the following measurement method is at least 6 g/10 min. and less than 20 g/10 min., and α of the film to be measured by the following measurement method is at least 0.99:

ETFE: a copolymer comprising tetrafluoroethylene units and ethylene units, wherein the molar ratio of tetrafluoroethylene units/ethylene units is from 60/40 to 40/60, and the proportion of units based on other monomer to the total of tetrafluoroethylene units and ethylene units is from 0 to 6 mol %, PFA: a copolymer comprising tetrafluoroethylene units and perfluoro(alkyl vinyl ether) units, wherein the molar ratio of tetrafluoroethylene units/perfluoro(alkyl vinyl ether) units is from 99/1 to 85/15, and the proportion of units based on other monomer to the total of tetrafluoroethylene units and perfluoro(alkyl vinyl ether) units is from 0 to 5 mol %, FEP: a copolymer comprising tetrafluoroethylene units and hexafluoropropylene units, wherein the molar ratio of tetrafluoroethylene units/hexafluoropropylene units is from 75/25 to 95/5, proportion of units based on other monomer to the total of tetrafluoroethylene units and hexafluoropropylene units is from 0 to 5 mol %, ECTFE: a copolymer comprising chlorotrifluoroethylene units and ethylene units, wherein the molar ratio of chlorotrifluoroethylene units/ethylene units is from 60/40 to 40/60, and the proportion of units based on other monomer to the total of chlorotrifluoroethylene units and ethylene units is from 0 to 5 mol %, PMP: a polymer comprising from 85 to 100 mol % of 4-methyl-1-pentene units and from 0 to 15 mol % of units based on at least one type of monomer selected from the group consisting of ethylene and $C_{3-20}$ α-olefins, (Measurement Method of the Melt Flow Rate of the Film)

In the case where the two kinds of resins are ETFE, measured in accordance with ASTM D3159 under a load of 49N at 297° C.; in the case where they are PFA, measured in accordance with ASTM D1238 under a load of 49N at 372° C.; in the case where they are FEP, measured in accordance with ASTM D1238 under a load of 49N at 372° C.; in the case where they are ECTFE, measured in accordance with ASTM D1238 under a load of 21.168N at a temperature of 271.5° C.; and in the case where they are PMP, measured in accordance with ASTM D1238 under a load of 49N at a temperature of 260° C., (Measurement Method of α of the Film)

With respect to the above film, in accordance with ISO 6721-10: 1999, using a melt viscoelasticity measuring machine, at the same measuring temperature as for the above melt flow rate, with 20 mm coaxial parallel discs set with a gap of 1 mm, the complex shear viscosity (Pa·s) at the time of applying a sine wave of each angular frequency of the following 15 points, is measured in a strain controlled system under a condition of a strain of 1%, Angular frequency: 0.31, 0.52, 0.84, 1.4, 2.3, 3.7, 6.1, 10, 16, 27, 44, 73, 120, 210, 310 (rad/s), When the measured complex shear viscosity is represented by η, and the angular frequency is represented by ω, in a graph having the respective natural logarithm LN (η) plotted on the vertical axis and LN (ω) plotted on the horizontal axis, an approximate quadratic function that contains all points is obtained by a least squares method in accordance with the following procedure, and the determination coefficient $R^2$ at that time is obtained in accordance with the following procedure, whereupon that value is taken as α, <Method for Obtaining Approximate Quadratic Function (Least Squares Method)>

In the (x, y) plane, (LN ($\eta_i$), LN ($\omega_i$)) are plotted, and the following equation is established $$E=\Sigma\{LN(\eta_i)-a_2LN^2(\omega_i)-a_1LN(\omega_i)-a_0\}$$

whereupon equations of partially differentiating E with the respective coefficients to be 0, i.e. the following ternary simultaneous equations are established:

$$\delta(E)/\delta a_2=0$$

$$\delta(E)/\delta a_1=0$$

$$\delta(E)/\delta a_0=0$$

and $a_2$, $a_1$ and $a_0$ satisfying the above equations are obtained; subscript i indicates to correspond to the i-th (i is an integer of 1 to 15) angular frequency among the above mentioned angular frequencies of 15 points; using the obtained $a_2$, $a_1$ and $a_0$ as coefficients, f $(x)=a_2x^2+a_1x+a_0$ is adopted as the approximate quadratic function, <Method for Obtaining Determination Coefficient $R^2$>

The determination coefficient $R^2$ is obtained by the following equation, $$R^2=1-(\Sigma(y_i-f_i)^2/\Sigma(y_i-y_a)^2)$$

wherein $y_i$ is LN ($\eta_i$), $f_i$ is an estimated value by the approximate quadratic function, and $y_a$ is an average value of LN ($\eta_i$).

[2] The film according to [1], wherein the blend resin is a blend material of a resin having a melt flow rate of from 4 to 7 g/10 min. and a resin having a melt flow rate of from 20 to 50 g/10 min.

[3] The film according to [2], wherein between the two kinds of resins, the ratio of the melt flow rate of the resin having a melt flow rate of from 20 to 50 g/10 min. to the melt flow rate of the resin having a melt flow rate of from 4 to 7 g/10 min., is from 3 to 12.

[4] The film according to any one of [1] to [3], wherein the blend resin is a blend material of two kinds of ETFE different in the melt flow rate of the resins, selected from ETFE comprising tetrafluoroethylene units, ethylene units and (perfluoroalkyl)ethylene units.

[5] The film according to any one of [1] to [3], wherein the blend resin is a blend material of two kinds of PFA different in the melt flow rate of the resins, selected from PFA comprising tetrafluoroethylene units and perfluoro(alkyl vinyl ether) units.

[6] The film according to any one of [1] to [3], wherein the blend resin is a blend material of two kinds of FEP different in the melt flow rate of the resins, selected from FEP comprising tetrafluoroethylene units, hexafluoropropylene units and perfluoro(alkyl vinyl ether) units.

[7] The film according to any one of [1] to [3], wherein the blend resin is a blend material of two kinds of ECTFE different in the melt flow rate of the resins, selected from ECTFE comprising chlorotrifluoroethylene units and ethylene units.

[8] The film according to any one of [1] to [3], wherein the blend resin is a blend material of two kinds of PMP different in the melt flow rate of the resins, selected from PMP comprising 4-methyl-1-pentene units and 1-octadecene units.

[9] The film according to any one of [1] to [8], which is a release film for the production of a semiconductor device.

[10] A method for producing a film as defined in any one of [1] to [8], characterized by using two kinds of resins both belonging to any one of said ETFE, PFA, FEP, ECTFE and PMP, wherein the melt flow rate of one resin is from 4 to 7 g/10 min. and the melt flow rate of the other resin is from 20 to 50 g/10 min., and blending the two kinds of resins, followed by molding into a film-form.

[11] The method for producing a film according to [10], wherein using an extrusion molding apparatus having a melt-kneading section provided with a screw and a cylinder that accommodates the screw, and a molding section provided with a die connected to the tip of the cylinder, the film is produced by setting the product ($\gamma \times (L_1/D)$) of the shear rate at the screw metering zone and the ratio of the length of the screw metering zone to the cylinder bore obtainable by the following formula, at the time of melt kneading the two kinds of resins, to be from 100 to 3,000 s$^{-1}$:

$$\gamma \times (L_1/D) = \pi \times L_1 \times N/(60 \times h)$$

where $\gamma$ is the shear rate (s$^{-1}$), $L_1$ is the length (mm) of the screw metering zone, D is the cylinder bore (mm), N is the screw rotation speed (rpm), and h is the groove depth (mm) of the screw metering zone.

Advantageous Effects of Invention

The film of the present invention is excellent in breakage resistance and uniform stretchability.

According to the method for producing a film of the present invention, it is possible to produce a film excellent in breakage resistance and uniform stretchability.

DESCRIPTION OF EMBODIMENTS

Meanings of terms in the present specification are as follows.

A "unit" is a general term for a group of atoms directly formed by polymerization of a monomer and derived from one molecule of the monomer and a group of atoms obtainable by chemically converting a part of said group of atoms. Further, units based on a specific monomer may be expressed by attaching "units" to the monomer name (e.g. units based on tetrafluoroethylene may be referred to also as tetrafluoroethylene units.)

"Other monomer units" in each of ETFE, PFA, FEP and ECTFE are meant for monomer units other than the essential monomer units in each copolymer (e.g. ethylene units and tetrafluoroethylene units in ETFE, or tetrafluoroethylene units and perfluoro(alkyl vinyl ether) in PFA). In each copolymer, to the total of all units, the total of the essential monomer units and other monomer units is 100 mol %. Further, a monomer which will be other monomer units may be referred to also as "other monomer".

A "film" is a molded product obtained by molding a resin into a film-form. The film may contain additives, in addition to the resin.

The arithmetic average roughness Ra is a value measured in accordance with JIS B0601: 2013 (ISO 4287: 1997, Amd. 1: 2009). The standard length lr (cut-off value $\lambda$c) for the roughness curve is set to be 0.8 mm.

[Film]

The film of the present invention is a single layer film and is made of a blend resin of two kinds of resins both belonging to any one of ETFE, PFA, FEP, ECTFE and PMP (hereinafter referred to also as "the same type of resins"); the melt flow rate of the film (hereinafter referred to also as "MER of the film") is at least 6 g/10 min. and less than 20 g/10 min.; and $\alpha$ of the film is at least 0.99.

In the present invention, MFR of the film means MFR obtained by folding the film, crushing it by a press at room temperature (20 to 25° C.), then finely cutting it to obtain chips, putting the chips in the cylinder of a MFR measuring instrument (manufactured by Toyo Seiki Co., Ltd., Melt Indexer G-01), and leaving them to stand for 5 minutes, followed by measurement by the following method.

Further, "MFR of the resin" which will be mentioned later, means MFR obtainable by measurement in the same manner as the above-mentioned MFR of the film with respect to a molding material (resin chips, beads, powder, etc.) before forming a film. "MFR of the resin" may sometimes be referred to simply as "MFR".

(MFR of Film)

MFR of the film is measured by the following method.

In the case where the two kinds of resins are ETFE, measured in accordance with ASTM D3159 under a load of 49N at 297° C., in the case where they are PFA, measured in accordance with ASTM D1238 under a load of 49N at 372° C., in the case where they are FEP, measured in accordance with ASTM D1238 under a load 49N at 372° C., in the case where they are ECTFE, measured in accordance with ASTM D1238 under a load of 21.168N at a temperature of 271.5° C., and in the case where they are PMP, measured in accordance with ASTM D1238 under a load 49N at a temperature of 260° C.

MFR of the film is an index for the molecular weight of the resin forming the film, and the larger the MFR, the smaller the molecular weight. In the film of the present invention, MFR of the film usually takes one value between the respective MFR of the blended two kinds of resins of the same type.

In the film of the present invention, MFR of the film is preferably from 8 to 18 g/10 min., particularly preferably from 10 to 15 g/10 min.

When MFR of the film is at least 8 g/10 min., the breakage resistance will be excellent, and the moldability of the film will also be excellent. When MFR of the film is at most 18 g/10 min., the uniform stretchability of the film will be excellent.

MFR of the film can be adjusted by the respective MFR of two kinds of resins of the same type to be blended (MFR of resins), the blending ratio, etc.

As the two kinds of resins of the same type, with a view to adjusting $\alpha$ to be at least 0.99, usually, resins differing in MFR of raw material resins (i.e. MFR of resins) are combined.

As between the two kinds of resins of the same type, MFR of a resin with a smaller MFR (hereinafter referred to also as a "low MFR resin") is preferably from 4 to 7 g/10 min., particularly preferably from 4 to 6 g/10 min. When MFR of the low MFR resin is at most 7 g/10 min., the breakage resistance of the film will be more excellent, and when it is at least 4 g/10 min., it will be uniformly blended.

As between the two kinds of resins of the same type, MFR of a resin with a larger MFR (hereinafter referred to also as a "high MFR resin") is preferably from 20 to 50 g/10 min., particularly preferably from 25 to 50 g/10 min. When MFR of the high MFR resin is at most 50 g/10 min., it will be uniformly blended, and when it is at least 20 g/10 min., the uniform stretchability of the film will be more excellent.

The ratio of MFR of the high MFR resin to MFR of the low MFR resin (MFR of the high MFR resin/MFR of the low MFR resin) is preferably from 3 to 12, particularly preferably from 4 to 10. If the ratio in MFR is at least 3, $\alpha$ easily tends to be at least 0.99, and when it is at most 12, the resins will be easily homogeneously blended.

(Blending Ratio of Two Kinds of Resins of the Same Type)

The blending ratio of the two kinds of resins of the same type is suitably set so that MFR of the film will be at least 6 g/10 min. and less than 20 g/10 min., and $\alpha$ will be at least 0.99. For example, the mass ratio of the low MFR resin/the high MFR resin is preferably from 20/80 to 80/20, particularly preferably from 30/70 to 70/30.

(Method for Measuring $\alpha$ of the Film)

$\alpha$ of the film is measured by the following method.

With respect to the film, using a melt viscoelasticity measuring machine, in accordance with ISO 6721-10: 1999, at the same measuring temperature as for the above-described MFR of the film, with 20 mm coaxial parallel discs set with a gap of 1 mm, the complex shear viscosity (Pa·s) at the time of applying a sine wave of each angular frequency of the following 15 points, is measured in a strain controlled system under a condition of a strain of 1%:

Angular frequency: 0.31, 0.52, 0.84, 1.4, 2.3, 3.7, 6.1, 10, 16, 27, 44, 73, 120, 210, 310 (rad/s)

When the measured complex shear viscosity is represented by $\eta$, and the angular frequency is represented by $\omega$, in a graph having the respective natural logarithm LN ($\eta$) plotted on the vertical axis and LN ($\omega$) plotted on the horizontal axis, an approximate quadratic function that contains all the points is obtained by a least squares method in accordance with the following procedure, and the determination coefficient $R^2$ at that time is obtained in accordance with the following procedure, whereupon that value is taken as $\alpha$.

<Method for Obtaining Approximate Quadratic Function (Least Squares Method)>

In the (x, y) plane, (LN ($\eta_i$), LN ($\omega_i$)) are plotted, and the following equation is established $$E=\Sigma\{LN(\eta_i)-a_2 LN^2(\omega_i)-a_1 LN(\omega_i)-a_0\}$$

whereupon equations of partially differentiating E with the respective coefficients to be 0, i.e. the following ternary simultaneous equations are established:

$$\delta(E)/\delta a_2 = 0$$

$$\delta(E)/\delta a_1 = 0$$

$$\delta(E)/\delta a_0 = 0$$

and $a_2$, $a_1$ and $a_0$ satisfying the above equations are obtained; subscript i indicates to correspond to the i-th (i is an integer of 1 to 15) angular frequency among the above mentioned angular frequencies of 15 points; using the obtained $a_2$, $a_1$ and $a_0$ as coefficients, f (x)=$a_2 x^2 + a_1 x + a_0$ is adopted as the approximate quadratic function.

<Method for Obtaining Determination Coefficient $R^2$>

The determination coefficient $R^2$ is obtained by the following equation, $$R^2 = 1 - (\Sigma(y_i - f_i)^2 / \Sigma(y_i - y_a)^2)$$

wherein $y_i$ is LN ($\eta_i$), $f_i$ is an estimated value by the approximate quadratic function, and $y_a$ is an average value of LN ($\eta_i$).

<Significance of $\alpha$>

The above $\alpha$ is an index for the molecular weight distribution of the blend resin constituting the film.

When $\alpha$ is at least 0.99, both the breakage resistance and uniform stretchability of the film will be excellent. $\alpha$ is preferably at least 0.990, particularly preferably at least 0.995. The upper limit of $\alpha$ is 1.

Figure 1:
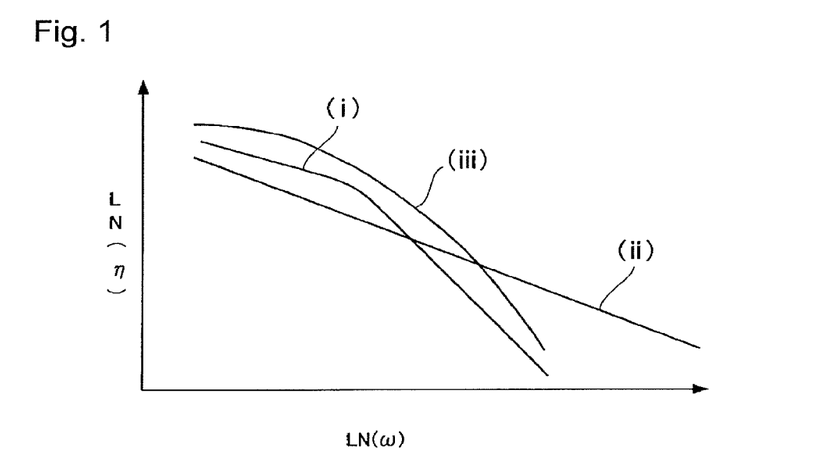
FIG. 1 is a diagram illustrating $\alpha$.

With reference to FIG. 1, $\alpha$ will be described.

In the case of ETFE, PFA, FEP, ECTFE, etc., it is difficult to measure the molecular weight distribution, but in the case of a single resin which is not blended, it has a single peak in the molecular weight distribution. In the case where the molecular weight distribution is narrow, a graph having LN ($\eta$) in the after-mentioned measurement method plotted on the vertical axis and LN ($\omega$) plotted on the horizontal axis, becomes a curve with an inflection point as shown by (i) in FIG. 1, and, as the molecular weight distribution becomes wider, it becomes closer to a linear function curve (a straight line) as shown by (ii) in FIG. 1.

That is, in the case of a resin having a narrow molecular weight distribution, a resin molecules having a uniform relaxation time are collected, whereby at the time of applying a strain of a shear rate less than the relaxation time, it shows a behavior of a Newtonian fluid, but if the shear rate exceeds a certain level, the resin becomes not to be relaxed all at once, whereby the viscosity decreases. The more the collection of molecules with different relaxation times, i.e. the wider the molecular weight distribution, the Newtonian region tends to be not observed, and the graph approaches a straight line.

In the case of the blend resin in the present invention, unlike the case of a single resin, the graph becomes a quadratic function curve or a curve close thereto as shown by (iii) in FIG. 1. $\alpha$ is one to indicate how much close the graph is to the quadratic function curve, and as $\alpha$ is close to 1, the graph becomes closer to the quadratic function, and when $\alpha$ is 1, the graph is a quadratic function curve.

$\alpha$ becoming at least 0.99 (the graph having LN ($\eta$) plotted on the vertical axis and LN ($\omega$) plotted on the horizontal axis, becoming a quadratic function curve or a curve close thereto) is considered to be attributable to such that the molecular weight distribution of the blend resin has two peaks, derived from peaks of molecular weight distributions of two kinds of resins of the same type forming the blend resin, and the degree of separation of such peaks and the spread, etc. of such peaks, are influential.

The two kinds of resins of the same type forming the blend resin are usually different in position of the peak of the molecular weight distribution, and thus are different in MFR. At that time, $\alpha$ may be adjusted by the difference in MFR between the two kinds of resins of the same type, the blending ratio (mass ratio), the melt extrusion conditions of the blend resin, etc. For example, the larger the difference in MFR between the two kinds of resins of the same type, $\alpha$ tends to be closer to 1. Further, the higher the shear rate at the time of melting the blend resin, $\alpha$ tends to be closer to 1.

In a case where the film is made of a single resin which is not blended, as the position of the peak in the molecular weight distribution of the resin is on the low molecular weight side (the high MFR side), the elongation becomes high and the breakage resistance is improved, but the strength tends to decrease and the uniform stretchability tends to decrease. As the position of the peak is on the high molecular weight side (the low MFR side), the strength becomes high and the uniform stretchability is improved, but the elongation tends to decrease, and the breakage resistance tends to decrease. Even if the molecular weight distribution is made wide to widen the width of the distribution, this tendency will not be changed. Therefore, it is difficult to let both the breakage resistance and the uniform stretchability of a film made of a single resin be excellent. Further, even in the case of a blend resin having two kinds of resins of the same type blended, if α is less than 0.99, the same tendency as in the case of a single resin is observed.

In the case of the blend resin in the present invention, the molecular weight distribution has two peaks, and it is possible to obtain the effect to improve the breakage resistance by the resin corresponding to the peak on the low molecular weight side (the high MFR side) and to obtain the effect to improve the uniform stretchability by the resin corresponding to the peak on the high molecular weight side (the low MFR side).

(ETFE)

ETFE is a copolymer comprising tetrafluoroethylene (hereinafter referred to also as "TFE") units and ethylene units (hereinafter referred to also as "E units"), wherein the molar ratio of TFE units/E units is from 60/40 to 40/60, and the proportion of other monomer units to the total of TFE units and E units is from 0 to 6 mol %.

In ETFE, the molar ratio of TFE units/E units is, from such a viewpoint that the heat resistance and mechanical strength will be more excellent, preferably from 60/40 to 50/50.

The proportion of other monomer units to the total of TFE units and E units is, from such a viewpoint that the that heat resistance and mechanical strength will be more excellent, preferably from 0.1 to 4 mol %.

Other monomer in ETFE is a monomer other than TFE and ethylene.

As such other monomer, a monomer having fluorine atoms, or a monomer having no fluorine atom may be mentioned.

In a case where ETFE contains other monomer units, the crystallinity of ETFE can be adjusted by the type or content of other monomer units. For example, by selecting other monomer units to be units based on a monomer having fluorine atoms, the crystallinity can be made to be low, and the tensile strength and elongation at a high temperature, particularly at about 180° C., will be improved.

The monomer having fluorine atoms may be a fluoroolefin having 2 or 3 carbon atoms (but excluding TFE), a fluoroalkyl ethylene represented by the formula $X(CF_2)_nCY=CH_2$ (wherein X and Y are each independently a hydrogen atom or a fluorine atom, and n is an integer of from 2 to 8), a fluorovinyl ether, a fluorinated monomer having an alicyclic structure, etc.

Specific examples of the above fluoroolefin include fluoroethylene (trifluoroethylene, vinylidene fluoride, vinyl fluoride, chlorotrifluoroethylene, etc.), fluoropropylene (hexafluoropropylene (hereinafter referred to also as "HFP"), hexafluoroisobutylene, 2-hydro-pentafluoropropylene, etc.), etc.

As the above fluoroalkyl ethylene, a monomer wherein n is from 2 to 6, is preferred, and a monomer wherein n is from 2 to 4 is particularly preferred. Further, a monomer wherein X is a fluorine atom, and Y is a hydrogen atom, i.e. a (perfluoroalkyl) ethylene is particularly preferred.

Specific examples of the above fluoroalkyl ethylene include $CH_2=CHCF_2CF_3$, $CH_2=CHCF_2CF_2CF_3$ ((perfluorobutyl)ethylene, hereinafter referred to also as "PFBE"), $CH_2=CFCF_2CF_2CF_3$, $CH_2=CFCF_2CF_2H$, and $CH_2=CFCF_2CF_2CF_2H$.

As the above fluorovinyl ether, a perfluorovinyl ether is preferred.

Specific examples of the above fluorovinyl ether include a perfluoro(alkyl vinyl ether) (hereinafter referred to also as "PAVE"), $CF_2=CFOCF_2CF=CF_2$, and $CF_2=CFO(CF_2)_2CF=CF_2$. Here, among the above, a monomer being a diene is a monomer capable of cyclic polymerization.

PAVE may, for example, be a compound represented by the formula $CF_2=CFOR^f$ (wherein $R^f$ is a $C_{1-10}$ perfluoroalkyl group which may contain an etheric oxygen atom). The perfluoroalkyl group in $R^f$ may be linear or branched. The number of carbon atoms in $R^f$ is preferably from 1 to 3.

Specific examples of the compound represented by the formula $CF_2=CFOR^f$ include $CF_2=CFOCF_3$, $CF_2=CFOCF_2CF_3$, $CF_2=CFOCF_2CF_2CF_3$ (perfluoro(propyl vinyl ether), hereinafter referred to as "PPVE"), $CF_2=CFOCF_2CF_2CF_2CF_3$, $CF_2=CFO(CF_2)_8F$, $CF_2=CFOCF_2CF(CF_3)O(CF_2)_2CF_3$, $CF_2=CFO(CF_2)_3O(CF_2)_2CF_3$, $CF_2=CFO(CF_2CF(CF_3)O)_2(CF_2)_2CF_3$, and $CF_2=CFOCF_2CF(CF_3)O(CF_2)_2CF_3$.

The above fluorovinyl ether may have a functional group.

Specific examples of the functional group-containing fluorovinyl ether include $CF_2=CFO(CF_2)_3CO_2CH_3$, $CF_2=CFOCF_2CF(CF_3)O(CF_2)_3CO_2CH_3$, and $CF_2=CFOCF_2CF(CF_3)O(CF_2)_2SO_2F$.

Specific examples of the above fluorinated monomer having an alicyclic structure include perfluoro(2,2-dimethyl-1,3-dioxole), 2,2,4-trifluoro-5-trifluoromethoxy-1,3-dioxole, and perfluoro(2-methylene-4-methyl-1,3-dioxolane).

The monomer having no fluorine atom may be an olefin, a vinyl ester, a vinyl ether, an unsaturated acid anhydride, etc.

Specific examples of the above olefin include propylene and isobutene.

A specific example of the above vinyl ester is vinyl acetate.

Specific examples of the above vinyl ether include ethyl vinyl ether, butyl vinyl ether, cyclohexyl vinyl ether, and hydroxybutyl vinyl ether.

Specific examples of the above unsaturated acid anhydride include maleic anhydride, itaconic anhydride, citraconic anhydride, and himic anhydride (5-norbornene-2,3-dicarboxylic acid anhydride).

As other monomer, one type may be used alone, or two or more types may be used in combination.

As other monomer, from such a viewpoint that it is easy to adjust the crystallinity, or from the viewpoint of excellent tensile strength and elongation at a high temperature (particularly at about 180° C.), a fluoroalkylethylene represented by the formula $X(CF_2)_nCY=CH_2$, HFP, PPVE, or vinyl acetate is preferred; HFP, PPVE, $CF_3CF_2CH=CH_2$ or PFBE is more preferred; and PFBE is particularly preferred. That is, as ETFE, a copolymer comprising TFE units, E units and PFBE units is particularly preferred.

In the two kinds of ETFE to be blended, the molar ratio of TFE units/E units, and the type and proportion of other monomer units, may be the same or different.

(PFA)

PFA is a copolymer comprising TFE units and PAVE units, wherein the molar ratio of TFE units/PAVE units is from 99/1 to 85/15, and the proportion of other monomer units to the total of TFE units and PAVE units is from 0 to 5 mol %.

In PFA, the molar ratio of TFE units/PAVE units is, from such a viewpoint that the heat resistance and mechanical strength will be more excellent, preferably from 99/1 to 95/5.

The proportion of other monomer units to the total of TFE units and PAVE units is, from such a viewpoint that the heat resistance and mechanical strength will be more excellent, preferably from 0 to 3 mol %.

As PAVE, the same ones as mentioned above may be mentioned, and the preferred embodiments are also the same.

Other monomer in PFA is a monomer other than TFE and PAVE. As such other monomer, a monomer exemplified as other monomer in ETFE (but excluding PAVE), ethylene, etc. may be mentioned, and HFP is preferred.

As other monomer, one type may be used alone, or two or more types may be used in combination.

In two kinds of PFA to be blended, the molar ratio of TFE units/PAVE units, and the type and proportion of other monomer units, may be the same or different.

(FEP)

FEP is a copolymer comprising TFE units and HFP units, wherein the molar ratio of TFE units/HFP units is from 75/25 to 95/5, and the proportion of other monomer units to the total of TFE units and HFP units is from 0 to 5 mol %.

In FEP, the molar ratio of TFE units/HFP units is, from such a viewpoint that the heat resistance and mechanical strength will be more excellent, preferably from 75/25 to 93/7.

The proportion of other monomer units to the total of TFE units and HFP units is, from such a viewpoint that the heat resistance and mechanical strength will be more excellent, preferably from 0 to 3 mol %.

Other monomer in FEP is a monomer other than TFE and HFP. As such other monomer, a monomer exemplified as other monomer in ETFE (but excluding FEP), ethylene, etc. may be mentioned, and PAVE is preferred.

As other monomer, one type may be used alone, or two or more types may be used in combination.

In two kinds of FEP to be blended, the molar ratio of TFE units/HFP units, and the type and proportion of other monomer units, may be the same or different.

(ECTFE)

ECTFE is a copolymer comprising chlorotrifluoroethylene (hereinafter referred to also as "CTFE") units and E units, wherein the molar ratio of CTFE units/E units is from 60/40 to 40/60, and the proportion of other monomer units to the total of CTFE units and E units is from 0 to 5 mol %.

In ECTFE, the molar ratio of CTFE units/E units is, from such a viewpoint that the heat resistance and mechanical strength will be more excellent, preferably from 55/45 to 45/55.

The proportion of other monomer units to the total of E units and CTFE units is, from such a viewpoint that the heat resistance and mechanical strength will be more excellent, preferably from 0 to 4 mol %.

Other monomer in ECTFE is a monomer other than CTFE and ethylene. As such other monomer, one mentioned as other monomer in ETFE (but excluding CTFE), TFE, etc. may be mentioned, and TFE, HFP, hexafluoroisobutylene, a perfluorovinyl ether compound, vinylidene fluoride, an olefin, etc. are preferred.

As other monomer, one type may be used alone, or two or more types may be used in combination.

In two kinds of ECTFE to be blended, the molar ratio of CTFE units/E units, and the type and proportion of other monomer units, may be the same or different.

(PMP)

PMP is a copolymer comprising from 85 to 100 mol % of 4-methyl-1-pentene (hereinafter referred to also as "MP") units and from 0 to 15 mol % of monomer units based on at least one monomer selected from the group consisting of ethylene and $C_{3-20}$ α-olefins. That is, it is a homopolymer of MP or a copolymer of MP and at least one monomer selected from the group consisting of ethylene and $C_{3-20}$ α-olefins.

In PMP, the proportion of MP units is preferably from 90 to 100 mol % to the total of all units which PMP contains.

Specific examples of $C_{3-20}$ α-olefins include propylene, 1-butene, 1-hexene, 1-octene, 1-decene, 1-tetradecene, and 1-octadecene.

In two kinds of PMP to be blended, the proportion of MP units (mol %), and the type of units based on at least one monomer selected from the group consisting of ethylene and $C_{3-20}$ α-olefins, may be the same or different.

As the resins constituting the blend resin, from the viewpoint of excellency in releasability, mold followability, etc. in a case where the film of the present invention is used as a release film for the production of a semiconductor device, ETFE, PFA, FEP or ECTFE is preferred, and ETFE is particularly preferred.

The film of the present invention may be one consisting solely of the blend resin, or may further contain, in addition to the blend resin, other components other than the blend resin. Specific examples of other components include various additives such as lubricants, antioxidants, antistatic agents, plasticizers, mold release agents, pigments, etc. One of these additives may be used alone, or two or more of them may be used in combination.

In a case where the film of the present invention is used as a release film for the production of a semiconductor device, it is preferred that the film of the present invention contains no other components, in that it is thereby less likely to contaminate the mold or package.

The surface of the film of the present invention may be smooth or may have irregularities formed thereon, or one surface may be smooth, while irregularities are formed on the other surface.

The surface shape when irregularities are formed thereon, may be such a shape that some or all of the plurality of protrusions and recesses are randomly distributed, or some or all of the plurality of protrusions and recesses are regularly arranged. The shapes or sizes of protrusions and recesses may be the same or different.

The protrusions may be elongated ridges extending on the surface of the release film, scattered projections, etc., and the recesses may be elongated grooves extending on the surface of the release film, interspersed holes, etc.

The shapes of the ridges or grooves may be lines, curves, bent shapes, etc. On the release film surface, a plurality of ridges or grooves may be present in parallel to form stripes. Of ridges or grooves, the cross-sectional shape in a direction perpendicular to the longitudinal direction, may be a polygonal shape such as triangular (V-shaped), semicircular, etc.

The shapes of the projections or holes may be polygonal pyramid such as triangular pyramid, pyramidal, hexagonal pyramid, etc., conical, hemispherical, polyhedral, other various irregular shapes, etc.

In a case where the film of the present invention is used as a release film for the production of a semiconductor device, the arithmetic average roughness Ra of the surface of the film of the present invention, in contact with the mold at the time of forming the resin sealing portion, is preferably from 0.2 to 2.5 µm, particularly preferably from 0.2 to 2.0 µm. When the arithmetic average roughness Ra is at least 0.2 µm, the surface and the mold are less likely to cause blocking, and wrinkles due to the blocking are less likely to be formed. Further, the releasability of the film from the mold is more excellent. When the arithmetic average roughness Ra is at most 2.5 µm, pin holes are less likely to be opened in the release film.

The thickness of the film of the present invention is preferably from 40 to 100 µm, particularly preferably from 40 to 75 µm. When the thickness of the film of the present invention is at most 100 µm, it is easily deformable and will be excellent in breakage resistance and mold followability. When the thickness of the film of the present invention is at least 40 µm, it will be excellent in uniform stretchability. Further, the handling of the film (e.g. the handling by roll-to-roll) will be easy, and at the time of disposing the film of the present invention to cover the mold cavity while pulling it, wrinkles are less likely to be formed.

(Method for Producing a Film)

The film of the present invention can be prepared by a conventional method, and, for example, a method for obtaining a film by blending the above-mentioned two kinds of resins of the same type, followed by molding into a film-form, may be mentioned.

Specific examples of the method for producing a film may be a method of molding the two kinds of resins of the same type into a film-form by a melt extrusion molding method, and a method of dissolving the two kinds of resins of the same type in a solvent and molding the obtained solution into a film-form by a casting method, and the former method is preferred. The production of a film by a melt extrusion molding method is preferably carried out by using an extrusion molding apparatus.

In the melt extrusion molding method, as a method of forming the two kinds of resins of the same type into a film-form, for example, the following methods 1 to 4 may be mentioned. Of these, from such a viewpoint that the two kinds of resins tend to be uniformly mixed, Method 3 and Method 4 are preferred, in which the two kinds of resins of the same type are preliminarily melt-blended and pelletized, and then the pellets are used.

Method 1: A method wherein dry-blended two kinds of resins of the same type are, as they are, directly introduced to an extrusion molding apparatus to form a film.

Method 2: A method wherein two kinds of resins of the same type not dry-blended, are, as they are, directly introduced to an extrusion molding apparatus to form a film.

Method 3: A method wherein dry-blended two kinds of resins of the same type are melted to prepare pellets, and the pellets are introduced to the extrusion molding apparatus to form a film.

Method 4: A method wherein two kinds of resins of the same type not dry-blended, are melt-blended to obtain pellets and the pellets are introduced to the extrusion molding apparatus to form a film.

In Methods 1 and 3, additives may be dry-blended together with two kinds of resins of the same type, or additives may be introduced to the extrusion molding apparatus together with dry-blended two kings of resins of the same type. In Methods 2 and 4, additives may be preliminarily dry-blended to either one or both of the two kinds of resins of the same type that are not dry-blended, or additives may be introduced to the extrusion molding apparatus together with the two kinds of resins. In Methods 3 and 4, additives may be introduced to the extrusion molding apparatus together with pellets.

In the production method of the present invention, it is preferred to produce a film by using an extrusion molding apparatus having a melt-kneading section provided with a screw and a cylinder accommodating the screw and a molding section provided with a die connected to the tip of the above-mentioned cylinder. Further, at the time of producing a film from the above-mentioned two kinds of resins by using an extrusion molding apparatus, it is preferred to produce the film by adjusting the product ($\gamma \times (L_1/D)$) of the shear rate at the screw metering zone and the ratio of the length of the screw metering zone to the cylinder bore, obtainable by the following formula, to be from 100 to 3,000 $s^{-1}$. By producing the film in such a manner, the breakage resistance and uniformity stretchability of the obtainable film become more excellent. The production of the film by using the extrusion molding apparatus may be carried out by any of the above-mentioned Methods 1 to 4.

$$\gamma \times (L_1/D) = \pi \times D \times N/(60 \times h) \times (L_1/D)$$
$$= \pi \times L_1 \times N/(60 \times h)$$

where, $\gamma$ is the shear rate ($s^{-1}$), $L_1$ is the length (mm) of the screw metering zone, D is the cylinder bore (mm), N is the screw rotation speed (rpm), and h is the groove depth (mm) of the screw metering zone.

The extrusion molding apparatus has a melt-kneading section provided with a screw and a cylinder accommodating the screw and a molding section provided with a die connected to the tip of the cylinder. As the extrusion molding apparatus, a known device may be employed.

As the screw, a known screw such as a single screw, a twin screw, etc. may be used. The space formed by the screw and the cylinder is divided, mainly from the upstream side in the flow direction, into three i.e. an introduction portion (supply portion), a compression portion (melting portion) and a metering portion. The introduction portion is a portion to feed the supplied raw material to the compression portion, the compression portion is a portion to compress, defoam and melt the raw material, and the metering portion is a portion to extrude a predetermined amount of the molten raw material. The shearing is exerted mainly at the metering portion.

As the die, a flat die (T-die), etc. may be mentioned.

Cooling can be carried out by a known method, and, for example, a method of winding up the extruded film-form melt-kneaded product on a cooling roll disposed near the outlet, may be mentioned.

A pressing roll may be disposed in the vicinity of the outlet of the die, so that the kneaded product may be passed between the pressing roll and the cooling roll. In this case, if either one or each of the pressing roll and the cooling roll is made of one having irregularities formed on the surface, at the time when the melt-kneaded product is passed between the pressing roll and the cooling roll, the irregularities formed on the surface of the roll will be continuously transferred to the surface of the melt-kneaded product, to obtain a film having irregularities formed on one side or each side.

After the cooling, if necessary, treatment such as heat treatment or coating treatment may be conducted.

The product ($\gamma \times (L_1/D)$) is an index for the shear rate applied to the resin at the screw metering portion and the time for applying such shearing. When this product ($\gamma \times (L_1/D)$) is at least 100 $s^{-1}$, sufficient shearing is applied to the resin, whereby the resin will be uniformly kneaded. When the product ($\gamma \times (L_1/D)$) is at most 3,000 $s^{-1}$, decomposition of the resin due to overheating will be less, whereby the molecular weight distribution will be stored in the same form as before the molding.

The product ($\gamma \times (L_1/D)$) is preferably from 150 to 2,000 s$^{-1}$, particularly preferably from 300 to 2,000 s$^{-1}$.

The screw rotation speed N at the time of melt-kneading is preferably from 40 to 75 rpm, particularly preferably from 45 to 70 rpm. When the screw rotation speed N is at least 40 rpm, sufficient shearing is applied to the resin, whereby the resin will be uniformly kneaded. When the screw rotation speed N is at most 75 rpm, it is possible to avoid an increase in MFR of the film by overheating of the resin.

The groove depth h in the screw metering portion is preferably from 1 to 5 mm. The groove depth h is equal to the height of the flight (the mountain portion which protrudes from the screw shaft), and it is obtainable by (the screw outer diameter (mm) of the screw metering portion–the diameter (mm) of the screw shaft)/2. When the groove depth h is at least 1 mm, it is possible to avoid overheating of the resin, and when it is at most 5 mm, the resin can be sufficiently kneaded in the cylinder.

$L_1/D$ is preferably from 6 to 8. When $L_1/D$ is within the above range, variation in the discharge amount of the melt-kneaded product will be little, and a proper shearing heat can be given to the melt-kneaded product.

The temperature in the extrusion molding apparatus at the time of the melt-kneading is usually a temperature at which the two kinds of resins will be melted, and as between the respective melting points of the two kinds of resins, it is preferably at least the melting point of the higher one (hereinafter referred to also as "$Tm^h$"), more preferably from ($Tm^h+10°$ C.) to ($Tm^h+150°$ C.), particularly preferably from ($Tm^h+20°$ C.) to ($Tm^h+100°$ C.). When the temperature in the extrusion molding apparatus is at least the lower limit value in the above range, a homogeneous melt-kneaded product is obtainable, and stable extrusion molding is possible. When the temperature in the extrusion molding apparatus is at most the upper limit value in the above range, it is possible to suppress degradation of the material due to thermal decomposition. The preferred range of the temperature of the die is also the same.

Advantageous Effects

The film of the present invention is made of a blend resin of two kinds of resins both belonging to any one of ETFE, PFA, FEP, ECTFE and PMP, wherein the MFR of the film is at least 6 g/10 min. and less than 20 g/10 min., and α of the film is at least 0.99, whereby the breakage resistance and uniform stretchability are excellent. Since the breakage resistance is excellent, when used as a release film for the production of a semiconductor device, it is less likely to rupture even when largely stretched and a load is locally exerted, in a case where the sealing area is large. Further, since the uniform stretchability is excellent, at the time of letting it follow the mold or at the time of letting a curable resin flow thereon, it entirely extends evenly. Therefore, at the time of sealing, a difference in local thickness is unlikely to occur in the release film. It is possible to suppress warping or non-uniformity in internal stress of the package, and to suppress a damage to a semiconductor chip, etc. by the package, and thus, it is possible to increase the reliability of the semiconductor device to be produced.

[Method for Producing Semiconductor Device]

The above-described film of the present invention is useful, for example, as a release film for the production of a semiconductor device (hereinafter referred to also as a "release film") to be used in the following method for producing a semiconductor device.

A method for producing a semiconductor device, comprising:

a step of disposing a release film for the production of a semiconductor device on the surface of a mold to be in contact with a curable resin, a step of disposing in the mold a structure comprising a semiconductor chip and a substrate on which the semiconductor chip is mounted, and filling a curable resin in a space in the mold and curing it, to form a resin sealing portion, thereby to obtain a sealed structure having said structure and said resin sealing portion, and a step of releasing the sealed structure from the mold.

In such a production method, the release film is, for example, at the time of forming the resin sealing portion, disposed to cover the surface (hereinafter referred to also as the "cavity surface") forming the cavity of a mold which has a cavity (space) of a shape corresponding to the shape of the resin sealing portion, and by being disposed between the formed resin sealing portion and the mold cavity surface, it facilitates release of the obtained sealed structure from the mold.

At the time of forming the resin sealing portion, the release film may be in close contact with at least a part of the surface of the semiconductor chip. It is thereby possible to prevent entry of the curable resin into that part, and to obtain a semiconductor device having a part of the semiconductor chip exposed.

As the semiconductor device, a transistor, an integrated circuit having diodes integrated, a light emitting diode having a light-emitting element, etc. may be mentioned.

The package shape of the integrated circuit may be one to cover the entire integrated circuit or may be one to cover a part of the integrated circuit (to expose a part of the integrated circuit), and as specific examples, BGA (Ball Grid Array), QFN (Quad Flat Non-leaded package), and SON (Small Outline Non-leaded package) may be mentioned.

As the semiconductor devices, from the viewpoint of productivity, ones to be produced through batch sealing and singulation are preferred, and as a specific example, integrated circuits wherein the sealing system is a MAP (Moldied Array Packaging) system or a WL (Wafer Lebel packaging) system may be mentioned.

As the semiconductor devices, from the viewpoint of usefulness of the present invention, ones wherein the thickness of the resin sealing portion is thick, i.e. ones wherein the depth of the mold cavity is deep, are preferred, and, for example, a NAND type flash memory, a power device or a sensor may be mentioned. The thickness of the resin sealing portion is preferably from 0.5 to 3.0 mm.

As a method for producing semiconductor devices, a known method may be employed. The production conditions may also be the same conditions as in a known method for producing semiconductor devices.

As a method for forming the resin sealing portion, a transfer molding method or a compression molding method is preferred. As the apparatus to be used at that time, it is possible to use a known transfer molding apparatus or compression molding apparatus.

Figure 2:
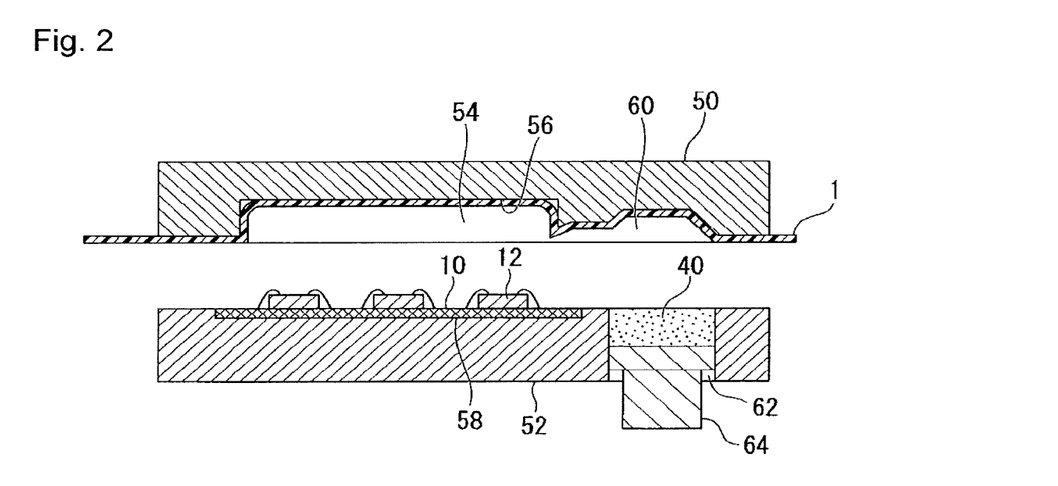
FIG. 2 is a cross-sectional view illustrating step 1 in an embodiment of the method for producing semiconductor devices.
Figure 3:
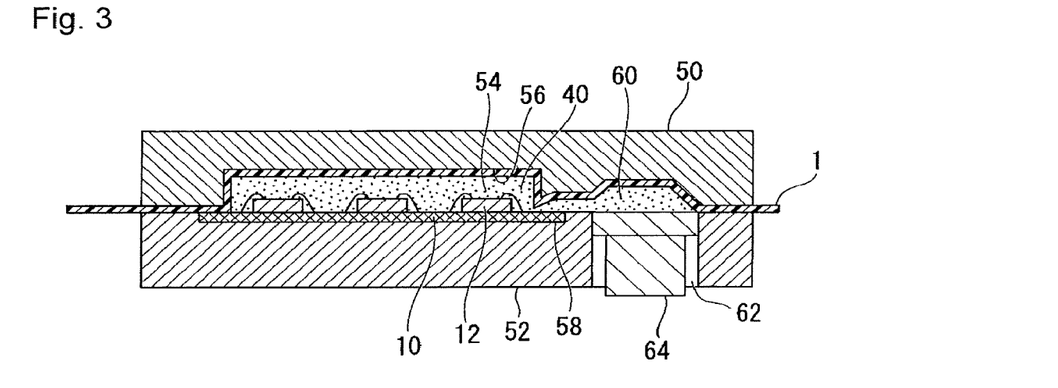
FIG. 3 is a cross-sectional view illustrating step 2 in an embodiment of the method for producing semiconductor devices.
Figure 4:
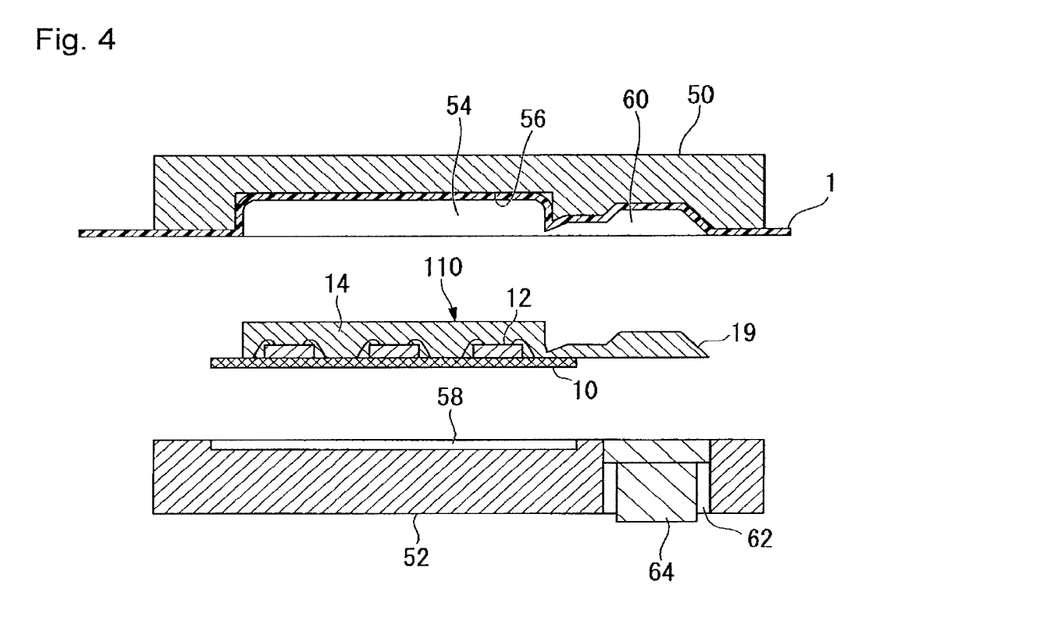
FIG. 4 is a cross-sectional view illustrating step 4 in an embodiment of the method for producing semiconductor devices.

With reference to FIGS. 2 to 4, a first embodiment of a method for producing semiconductor devices according to a transfer molding method will be described.

The method for producing semiconductor devices of this embodiment comprises the following step 1 to step 5.

Step 1: A step wherein in a mold having an upper mold 50 and a lower mold 52, a release film 1 is disposed so that release film 1 covers the cavity 54 of the upper mold 50, and vacuum-suctioned towards the cavity surface 56 side of the upper mold 50; separately, of an assembly (structure) having a plurality of semiconductor chips 12 mounted on the surface of a substrate 10, the substrate 10 is disposed at the substrate installing portion 58 of the lower mold 52 (FIG. 2).

Step 2: A step wherein the mold is clamped, and a plunger 64 of a resin placement portion 62 of the lower mold 52 is pushed up, to fill a curable resin 40 which is previously disposed at the resin placement portion 62, into the mold cavity 54 through a resin introduction portion 60 of the upper mold 50 (FIG. 3).

Step 3: A step wherein the curable resin 40 filled in the cavity 54 is cured to form a resin sealing portion 14 to obtain a batch sealed body 110.

Step 4: A step wherein the batch sealed body 110 is taken out from the mold (FIG. 4).

Step 5: A step wherein the batch sealed body 110 is cut (singulated) so that the plurality of semiconductor chips 12 are separated to obtain a plurality of semiconductor devices.

As the release film 1, the film of the present invention as described above is used.

In step 4, to the resin sealing portion 14 of the batch sealed body 110 taken out from the mold, a cured product 19 having the curable resin 40 cured in the resin introduction portion 60 is attached. The cured product 19 will be usually cut off.

In the method for producing semiconductor devices, the sealing area is not particularly limited, but, from the viewpoint of the productivity, it is preferably at least 14,000 mm$^2$. The upper limit of the sealing area is usually 250,000 mm$^2$. Here, the sealing area is the size of the mold cavity, and, in this embodiment, is the area of the resin sealing portion 14 in a plan view from above in a vertical direction to the substrate 10 surface.

In a case where the uniform stretchability of the release film 1 is good, it is prevented that at corner positions of the batch sealed body, the release film 1 is abruptly stretched and becomes thin, whereby the height of horns becomes low.

The height of horns of the batch sealed body at the time of being sealed by means of the release film 1 is, from such a viewpoint that a damage to the interior of the semiconductor device by the above horns is reduced and the reliability in the reliability test will be increased, preferably at most 3%, more preferably at most 2%, particularly preferably 0% (i.e. having no horn), to the average thickness of the resin sealing portion 14.

The method for producing semiconductor devices is not limited to the above embodiment. In the above embodiment, the respective constructions and their combinations are exemplary, and within a range not departing from the concept of the present invention, additions, omissions, substitutions and other modifications of the constructions, are possible.

The timing for peeling the release film 1 and the batch sealed body is not limited to at the time when the batch sealed body is taken out from the mold. For example, the batch sealed body may be taken out together with the release film from the mold, and then, the release film may be peeled off from the batch sealed body.

The distance between the plurality of semiconductor devices to be batch sealed, may be uniform or non-uniform. From such a viewpoint that sealing can be made uniformly, and the load to be exerted to each of the plurality of semiconductor devices becomes uniform (the load becomes minimum), it is preferred to equalize the distance between the plurality of semiconductor devices.

The mold is not limited to one shown in FIGS. 2 to 4, and a known one may be used as a mold to be used in the transfer molding method.

Before or after step 5, as the case requires, a step of forming an ink layer on the surface of the resin sealing portion 14 by means of an ink, may be conducted. However, in the case of producing light emitting diodes as semiconductor devices, the resin sealing portion functions also as a lens portion, and therefore, no ink layer is usually formed on the surface of the resin sealing portion.

The molding method to be used for the method for producing semiconductor devices is not limited to a transfer molding method, and another molding method such as a compression molding method may be used.

The semiconductor devices to be produced are not limited to ones shown in the above embodiment. Step 5 may not be conducted depending upon semiconductor devices to be produced. The number of semiconductor devices to be sealed in the resin sealing portion may be one or more. The shape of the resin sealing portion is not limited to the substantially rectangular cross-section as shown in FIG. 4, and there may be steps, etc. When the resin sealing portion is a lens portion, as the shape of the resin sealing portion, various lens shapes, such as substantially hemispherical, shell-type, Fresnel lens type, semi-cylindrical, substantially hemispherical lens array, etc. may be employed.

EXAMPLES

In the following, the present invention will be described in detail with reference to Examples. However, the present invention is not limited by the following description.

Among Ex. 1 to 18 as described below, Ex. 1 to 9 are Examples of the present invention, and Ex. 10 to 18 are Comparative Examples.

The evaluation methods and materials used in the respective Ex. are as follows.

[Evaluation Methods]

(Thickness)

The thickness (μm) of a film was measured in accordance with ISO 4591: 1992 (JIS K7130: 1999, B1 method, i.e. the method for measuring the thickness by a mass method of samples taken from a plastic film or sheet).

(MFR)

MFR of a resin (including a blend resin) was measured under the following conditions after putting the resin in a cylinder of a MFR measuring instrument (manufactured by Toyo Seiki Seisaku, Melt Indexer G-01) and leaving it to stand for 5 minutes. MFR of a film was measured under the following conditions, by folding the film, crushing it by a press at room temperature (20 to 25° C.), followed by finely cutting it to obtain chips, and using the chips.

MFR was, when the resin was ETFE, measured under a load of 49N at 297° C. in accordance with ASTM D3159, in the case of PFA, measured under a load of 49N at 372° C. in accordance with ASTM D1238, in the case of FEP, measured under a load of 49N at 372° C. in accordance with ASTM D1238, in the case of ECTFE, measured under a load of 21.168N at a temperature of 271.5° C. in accordance with ASTM D1238, and in the case of PMP, measured under a load of 49N at a temperature of 260° C. in accordance with ASTM D1238.

(α (Determination Coefficient $R^2$))

With respect to a film, in accordance with ISO 6721-10: 1999, using a melt viscoelasticity measuring machine (manufactured by Malvern Co., product name: Bohlin Gemini II), at the same measurement temperature as for the above melt flow rate, with 20 mm coaxial parallel discs set with a gap of 1 mm, the complex shear viscosity (Pa·s) at the time of applying a sine wave with each angular frequency of the following 15 points, is measured under a condition of a strain being at 1% in a strain controlled system:

Angular frequency: 0.31, 0.52, 0.84, 1.4, 2.3, 3.7, 6.1, 10, 16, 27, 44, 73, 120, 210, 310 (rad/s).

When the measured complex shear viscosity is represented by η, and the angular frequency is represented by ω, in a graph having the respective natural logarithm LN (η) plotted on the vertical axis and LN (ω) plotted on the horizontal axis, the approximate quadratic function that contains all points, is obtained by a least squares method in accordance with the following procedure, and the determination coefficient $R^2$ at that time is obtained in accordance with the following procedure, whereupon that value is taken as α.

<Method for Obtaining Approximate Quadratic Function (Least Squares Method)>

In the (x, y) plane, (LN ($\eta_i$), LN ($\omega_i$)) are plotted, and the following equation is established:

$$E = \Sigma\{LN(\eta_i) - a_2 LN^2(\omega_i) - a_1 LN(\omega_i) - a_0\}$$

whereupon equations of partially differentiating E with the respective coefficients to be 0, i.e. the following ternary simultaneous equations are established:

$$\delta(E)/\delta a_2 = 0$$

$$\delta(E)/\delta a_1 = 0$$

$$\delta(E)/\delta a_0 = 0$$

and $a_2$, $a_1$ and $a_0$ satisfying the above equations are obtained; subscript i indicates to correspond to the i-th (i is an integer of 1 to 15) angular frequency among the above mentioned angular frequencies of 15 points; and using the obtained $a_2$, $a_1$ and $a_0$ as coefficients, $f(x) = a_2 x^2 + a_1 x + a_0$ is adopted as the approximate quadratic function, <Method for Obtaining Determination Coefficient $R^2$>

The determination coefficient $R^2$ is obtained by the following equation, $$R^2 = 1 - (\Sigma(y_i - f_i)^2 / \Sigma(y_i - y_a)^2)$$

wherein $y_i$ is LN ($\eta_i$), $f_i$ is an estimated value by the approximate quadratic function, and $y_a$ is an average value of LN ($\eta_i$).

(Releasability (Peeling Test))

Using a film as a release film, a batch sealed body was obtained by the following procedure.

A structure having 900 semiconductor chips mounted on a 300 mm×100 mm rectangular substrate was prepared, and using a compression molding apparatus, in accordance with the above method, a resin sealing portion (a cured product of a curable resin) for sealing the semiconductor chips by a curable resin was formed in a thickness of 0.5 mm, to obtain a batch sealed body. When the mold after molding was opened, the state of peeling of the release film and the resin sealing portion was visually observed and evaluated by the following standards.

○ (good): Normally peeled.

Δ (acceptable): The release film lightly adhered to the resin sealing portion and was peeled while being stretched.

x (bad): The release film adhered to the sealed body and was not peeled.

(Breakage Resistance (Pinhole Confirmation Test))

At the time of obtaining the batch sealed body in the peeling test, the film was recovered from the mold, and the presence or absence of pinholes at corners of the film and the presence or absence of leakage of the curable resin were visually observed and evaluated by the following standards.

○ (good): No pinhole was confirmed.

Δ (acceptable): Pinholes were confirmed, but the curable resin was not leaking.

x (bad): Pinholes were confirmed, and the curable resin was leaking.

However, with respect to one whereby the evaluation result of the release test was bad, evaluation of the breakage resistance was not conducted.

(Horn Height)

With respect to the batch sealed body obtained in the evaluation of the above release test, the thickness at the center of the resin sealing portion and the thickness of the end portion were respectively measured by a micro gauge, whereupon the thickness of the center portion was subtracted from the thickness of the end portion to calculate the thickness difference (μm) of the resin sealing portion. And, that value was divided by the thickness (μm) of the center portion to obtain a value which was taken as the horn height (%). Here, the lower the horn height, the better the uniform stretchability.

However, with respect to one whereby the evaluation results of the release test and the pinhole confirmation test were bad, evaluation of the horn height was not conducted.

(Reliability (Thermal Cycle Test))

The batch sealed body obtained by the above release test was subjected to dicing to obtain 900 single semiconductor devices. They were subjected to the following thermal cycle test.

The thermal cycle test was conducted in accordance with IEC60068-2-14 (2009) ("Test Na: rapid temperature change test transferring in a specified time"). Using the thermal shock tester TSA series (manufactured by Espec Corp.), the low temperature was set to be −40° C., and the high temperature was set to be 120° C. The transition time from the low temperature side to the high temperature side and from the high temperature side to the low temperature side, was set to be 10 minutes, and the exposure time at the respective temperatures was set to be 3 hours, and the number of cycles was set to be 5 cycles.

After the thermal cycle test, each semiconductor device was visually observed to confirm the presence or absence of peeling of the sealing portion and the substrate, whereby the reliability of the semiconductor device was evaluated by the following standards.

○ (good): A semiconductor device having the resin sealing portion and the substrate peeled was found to be 0.

Δ (acceptable): A semiconductor device having the resin sealing portion and the substrate peeled was found to be at least one and at most three.

x (bad): A semiconductor device having the resin sealing portion and the substrate peeled was found to be at least four.

However, with respect to one whereby the evaluation results of the release test and the pinhole confirmation test were bad, evaluation of the reliability was not conducted.

[Materials Used]

(ETFE)

ETFE1: A copolymer of TFE units/E units/PFBE units=54/46/1.5 (molar ratio) (synthetic product produced in Production Example 1 given below), MFR: 4 g/10 min., Tm: 260° C.

ETFE2: A copolymer of TFE units/E units/PFBE units=54/46/1.5 (molar ratio) (synthetic product produced in Production Example 2 given below), MFR: 40 g/10 min., Tm: 260° C.

ETFE3: A copolymer of TFE units/E units/PFBE units=54/46/1.5 (molar ratio) (synthetic product produced in Production Example 3 given below), MFR: 6 g/10 min., Tm: 260° C.

ETFE4: A copolymer of TFE units/E units/PFBE units=54/46/1.5 (molar ratio) (synthetic product produced in Production Example 4 given below), MFR: 20 g/10 min., Tm: 260° C.

ETFE5: A copolymer of TFE units/E units/PFBE units=54/46/1.5 (molar ratio) (synthetic product produced in Production Example 5 given below), MFR: 10 g/10 min., Tm: 260° C.

ETFE6: A copolymer of TFE units/E units/PFBE units=54/46/1.5 (molar ratio) (synthetic product produced in Production Example 6 given below), MFR: 8 g/10 min., Tm: 260° C.

ETFE7: A copolymer of TFE units/E units/PFBE units=54/46/1.5 (molar ratio) (synthetic product produced in Production Example 7 given below), MFR: 13 g/10 min., Tm: 260° C.

ETFE8: A blend resin of ETFE1/ETFE2=2/1 (mass ratio), MFR: 10 g/10 min., Tm: 260° C.

ETFE9: A blend resin of ETFE3/ETFE4=1.5/1 (mass ratio), MFR: 10 g/10 min., Tm: 260° C.

ETFE10: A blend resin of ETFE1/ETFE2=1.5/1 (mass ratio), MFR: 15: g/10 min., Tm: 260° C.

ETFE11: A blend resin of ETFE1/ETFE2=1/1 (mass ratio), MFR: 20 g/10 min., Tm: 260° C.

ETFE12: A blend resin of ETFE6/ETFE7=1/1 (mass ratio), MFR: 10 g/10 min., Tm: 260° C.

(PFA)

PFA1: A copolymer of TFE units/PPVE units=98.5/1.5 (molar ratio) (synthetic product produced in Production Example 8 given below), MFR: 4 g/10 min., Tm: 305° C.

PFA2: A copolymer of TFE units/PPVE units=98.5/1.5 (molar ratio) (synthetic product produced in Production Example 9 given below), MFR: 40 g/10 min., Tm: 305° C.

PFA3: A blend resin of PFA1/PFA2=2/1 (mass ratio), MFR: 10 g/10 min., Tm: 305° C.

(FEP)

FEP1: A copolymer of TFE units/HFP units/PPVE units=90/9/1 (molar ratio), manufactured by Daikin Industries Co., Ltd., trade name "NEOFLON (registered trademark, hereinafter the same) NP-30", MFR: 4 g/10 min., Tm: 270° C.

FEP2: A copolymer of TFE units/HFP units/PPVE units=90/9/1 (molar ratio), manufactured by Daikin Industries Co., Ltd., trade name "NEOFLON NP-102", MFR: 30 g/10 min., Tm: 270° C.

FEP3: A copolymer of TFE units/HFP units/PPVE units=90/9/1 (molar ratio), manufactured by Daikin Industries Co., Ltd., trade name "NEOFLON NP-120", MFR: 10 g/10 min., Tm: 270° C.

FEP4: A blend resin of FEP1/FEP2=2/1 (mass ratio), MFR: 10 g/10 min., Tm: 270° C.

(ECTFE)

ECTFE1: A copolymer of CTFE units/E units=50/50 (molar ratio), manufactured by Solvay Plastics Co., Ltd., trade name "Halar (registered trademark, hereinafter the same) 350", MFR: 4 g/10 min., Tm: 240° C.

ECTFE2: A copolymer of CTFE units/E units=50/50 (molar ratio), manufactured by Solvay Plastics Co., Ltd., trade name "Halar 1450", MFR: 40 g/10 min., Tm: 240° C.

ECTFE3: A copolymer of CTFE units/E units=50/50 (molar ratio), manufactured by Solvay Plastics Co., Ltd., trade name "Halar 500", MFR: 15 g/10 min., Tm: 240° C.

ECTFE4: A blend resin of ECTFE1/ECTFE2=2/1 (mass ratio), MFR: 10 g/10 min., Tm: 240° C.

(PMP)

PMP1: A copolymer of MP units/1-octadecene units=95/5 (molar ratio), manufactured by Mitsui Chemicals, Inc., trade name "TPX (registered trademark, hereinafter the same) DX845", MFR: 4 g/10 min., Tm: 230° C.

PMP2: A copolymer of MP units/1-octadecene units=95/5 (molar ratio), manufactured by Mitsui Chemicals, Inc., trade name "TPX RT18", MFR: 40 g/10 min., Tm: 230° C.

PMP3: A blend resin of PMP1/PMP2=2/1 (mass ratio), MFR: 10 g/10 min., Tm: 230° C.

The blend resins were obtained by blending the respective resins in the above-mentioned ratios by the method for producing a blend resin as described below.

Production Example 1: Production of ETFE1

A polymerization vessel having an internal volume of 1.3 L and equipped with a stirrer, was deaerated, 954.9 g of 1-hydrotridecafluorohexane, 267.8 g of 1,3-dichloro-1,1,2,2,3-pentafluoropropane (trade name "AK225cb" manufactured by Asahi Glass Company, Limited, hereinafter referred to also as "AK225cb") and 7.0 g of PFBE were charged, 165.2 g of TFE and 9.8 g of ethylene were injected, the inside of the polymerization vessel was heated to 66° C., and 7.7 mL of an AK225cb solution containing 1 mass % of tert-butyl peroxypivalate (hereinafter referred to also as "PBPV") was charged as a polymerization initiator solution to initiate the polymerization. In order to maintain the pressure to be constant during the polymerization, a mixed gas of monomers of TFE/ethylene=54/46 (molar ratio) was continuously charged. Further, along with the charging of the mixed gas, PFBE was charged continuously in an amount corresponding to 1.4 mol % to the total moles of TFE and ethylene. After 2.9 hours from the initiation of the polymerization, at the time when 100 g of the above mixed gas was charged, the inside temperature of the polymerization vessel was lowered to room temperature and, at the same time, the pressure of the polymerization vessel was purged to normal pressure to complete the polymerization. Thereafter, the obtained slurry was suction-filtered through a glass filter, and the solid content was recovered and dried at 150° C. for 15 hours to obtain 107 g of ETFE1.

Production Examples 2 to 7: Production of ETFE2 to 7

ETFE2 to 7 were obtained in the same manner as in Production Example 1, except that the charged amounts of the respective components prior to raising the inside temperature of the polymerization vessel, were changed as shown in Table 1.

TABLE 1

| | Production Examples | | | | | | |
|---|---|---|---|---|---|---|---|
| | 1 | 2 | 3 | 4 | 5 | 6 | 7 |
| 1-Hydrotridecafluorohexane (g) | 954.9 | 654.9 | 934.9 | 754.9 | 884.9 | 914.9 | 864.9 |
| AK225cb (g) | 267.8 | 567.8 | 287.8 | 467.8 | 337.8 | 307.8 | 357.8 |

TABLE 1-continued

| | Production Examples | | | | | | |
|---|---|---|---|---|---|---|---|
| | 1 | 2 | 3 | 4 | 5 | 6 | 7 |
| PFBE (g) | 7.0 | 7.0 | 7.0 | 7.0 | 7.0 | 7.0 | 7.0 |
| TFE (g) | 165.2 | 165.2 | 165.2 | 165.2 | 165.2 | 165.2 | 165.2 |
| E (g) | 9.8 | 9.8 | 9.8 | 9.8 | 9.8 | 9.8 | 9.8 |
| Kind of obtained ETFE | ETFE1 | ETFE2 | ETFE3 | ETFE4 | ETFE5 | ETFE6 | ETFE7 |
| Yield of ETFE (g) | 107 | 107 | 107 | 107 | 107 | 107 | 107 |
| MFR of resin (g/10 min.) | 4 | 40 | 6 | 20 | 10 | 8 | 13 |

Production Example 8: Production of PFA1

A polymerization vessel having an internal volume of 1.3 L and equipped with a stirrer, was deaerated, 682.8 g of ion-exchanged water subjected to nitrogen replacement, 377.5 g of AK225cb, 28 g of PPVE and 41 g of methanol were charged, 105 g of TFE was injected, the inside of the polymerization vessel was raised to 66° C., and as a polymerization initiator solution, 3.8 mL of an AK225cb solution containing 0.05 mass % of heptafluorobutyroyl peroxide (hereinafter referred to also as "PFB") was charged to initiate polymerization. In order to maintain the pressure during the polymerization to be constant, TFE was continuously charged. Further, in order to maintain the polymerization rate to be constant, 24 mL of an AK225cb solution containing 0.05 mass % of PFB and 2 mass % of PPVE was charged continuously. After 3.4 hours from the initiation of the polymerization, at the time when 160 g of TFE was charged, the inside temperature of the polymerization vessel was lowered to room temperature, and at the same time, the pressure in the polymerization vessel was purged to normal pressure to complete the polymerization. Thereafter, the obtained slurry was suction-filtered through a glass filter, and the solid content was recovered and dried at 150° C. for 15 hours to obtain 170 g of PFA1.

Production Example 9: Production of PFA2

PFA2 was obtained in the same manner as in Production Example 8, except that the changed amounts of the respective components before raising the inside temperature of the polymerization vessel, were changed as shown in Table 2.

TABLE 2

| | Production Examples | |
|---|---|---|
| | 8 | 9 |
| Ion-exchanged water (g) | 682.8 | 562.8 |
| AK225cb (g) | 377.5 | 377.5 |
| PPVE (g) | 28 | 28 |
| Methanol (g) | 41 | 161 |
| TFE (g) | 105 | 105 |
| Kind of obtained PFA | PFA1 | PFA2 |
| Yield of PFA (g) | 170 | 170 |
| MFR of resin (g/min.) | 4 | 40 |

[Method for Producing Blend Resin Pellets]
Using a twin-screw extruder with a cylinder bore D=15 mm and L/D=30, two kinds of resin pellets were mixed at a predetermined mass ratio and supplied, whereby by melt extrusion, blended resin pellets were produced. L represents the total length of the screw.

[Method for Producing Film]
Using an extrusion molding apparatus, a film was produced by selecting one condition among the three production conditions A to C as shown in Table 3. Specifically, the production of a film was conducted in such a manner that by the extrusion molding apparatus, a resin (a single resin or a blend resin) was melt-kneaded, and the melt-kneaded product was extruded in a film-form through a die, followed by cooling.
<Extrusion Conditions>
Cylinder bore D of the melt-kneading section: 65 mm
Screw: full flight type, the total length L
Die: 700 mm wide coat hanger die
Lip opening: 0.7 mm The product ($\gamma \times (L_1/D)$) of the shear rate under the production conditions A to C and (the ratio of the length of the screw metering zone to the cylinder bore) was obtained by the following equation. The obtained values are also shown in Table 3.

$$\gamma \times (L_1/D) = \pi \times L_1 \times N/(60 \times h)$$

$$\gamma = \pi \cdot D \times N/(60 \cdot h)$$

where $\gamma$ represents the shear rate ($s^{-1}$), $L_1$ represents the length of the screw metering zone (mm), D represents a cylinder bore (mm), N represents the screw rotation speed (rpm), and h represents the groove depth (mm) of the screw metering zone.

TABLE 3

| | Production condition | | |
|---|---|---|---|
| | A | B | C |
| Screw L/D | 27 | 32 | 22 |
| Length $L_1$ of only screw metering zone/D | 7 | 9 | 5 |
| Depth (mm) of screw metering zone | 3 | 2 | 4 |
| Screw rotation speed (rpm) | 60 | 80 | 35 |
| Shear rate ($s^{-1}$) | 94 | 188 | 41 |
| $\gamma \times (L_1/D)$ | 658 | 1,692 | 205 |

[Ex. 1]
By setting the temperature of the melt-kneading section and the molding section of the extrusion molding apparatus (hereinafter referred to as the "extrusion temperature") to be 300° C., pellets of ETFE8 were introduced into the extrusion molding apparatus, and a film having a thickness of 50 μm was produced under the production condition A.

[Ex. 2 to 18]
A film having a thickness of 50 μm was produced in the same manner as in Ex. 1, except that the extrusion temperature, the type of the resin and the production condition were as shown in Tables 4 to 5.

With respect to the ETFE film obtained in each Ex., the evaluation results of MFR, α, releasability, breakage resistance, horn height and reliability of the film are shown in Tables 4 to 5.

was used, and MFR was made higher than in Ex. 11, since MFR was high, the elongation was high, but since α was as low as 0.5, the strength was low, and the uniform stretchability was bad.

TABLE 4

|  | Ex. | | | | | | | | |
|---|---|---|---|---|---|---|---|---|---|
|  | 1 | 2 | 3 | 4 | 5 | 6 | 7 | 8 | 9 |
| Resin | ETFE8 | ETFE9 | ETFE10 | PFA3 | FEP4 | PMP3 | ECTFE4 | ETFE8 | ETFE8 |
| Extrusion temperature (° C.) | 300 | 300 | 300 | 350 | 330 | 280 | 300 | 300 | 300 |
| Production condition | A | A | A | A | A | A | A | B | C |
| Film thickness (μm) | 50 | 50 | 50 | 50 | 50 | 50 | 50 | 50 | 50 |
| Film MFR (g/10 min) | 11 | 11 | 16 | 11 | 11 | 16 | 11 | 16 | 10 |
| α | 0.999 | 0.995 | 0.999 | 0.999 | 0.999 | 0.99 | 0.999 | 0.999 | 0.99 |
| Releasability | ◯ | ◯ | ◯ | ◯ | ◯ | Δ | ◯ | ◯ | ◯ |
| Breakage resistance | ◯ | ◯ | ◯ | ◯ | ◯ | Δ | ◯ | ◯ | Δ |
| Horn height (%) | 1 | 1 | 2.5 | 1 | 1 | 2.5 | 1 | 2.5 | 1 |
| Reliability | ◯ | ◯ | Δ | ◯ | ◯ | Δ | ◯ | Δ | ◯ |

TABLE 5

|  | Ex. | | | | | | | | |
|---|---|---|---|---|---|---|---|---|---|
|  | 10 | 11 | 12 | 13 | 14 | 15 | 16 | 17 | 18 |
| Resin | ETFE1 | ETFE5 | ETFE2 | ETFE11 | ETFE12 | PFA2 | FEP3 | PMP1 | ECTFE3 |
| Extrusion temperature (° C.) | 300 | 300 | 300 | 300 | 300 | 350 | 330 | 280 | 300 |
| Production condition | A | A | A | A | A | A | A | A | A |
| Film thickness (μm) | 50 | 50 | 50 | 50 | 50 | 50 | 50 | 50 | 50 |
| Film MFR (g/10 min) | 4 | 10 | 40 | 20 | 10 | 40 | 11 | 11 | 16 |
| α | 0.5 | 0.5 | 0.5 | 0.99 | 0.9 | 0.5 | 0.5 | 0.5 | 0.5 |
| Releasability | ◯ | ◯ | ◯ | ◯ | ◯ | ◯ | ◯ | Δ | ◯ |
| Breakage resistance | X | X | ◯ | ◯ | X | ◯ | X | X | X |
| Horn height (%) | — | — | 5 | 4 | — | 5 | — | — | — |
| Reliability | — | — | X | X | — | X | — | — | — |

The films in Ex. 1 to 9 were excellent in releasability and breakage resistance. Further, the horn height was at most 3%, whereby it was confirmed that they were excellent in uniform stretchability.

Further, in comparison of Ex. 1, 8 and 9 which are the same except for the production conditions, in Ex. 1 and 8 wherein the product ($\gamma \times (L_1/D)$) of the shear rate of the screw metering zone during melt-kneading and (the ratio of the length of the screw metering zone to the cylinder bore) was from 300 to 2,000 s$^{-1}$ (i.e. in the particularly preferred range), as compared with in Ex. 9 wherein the product ($\gamma \times (L_1/D)$) was less than 300 s$^{-1}$, kneading was sufficiently done, whereby α was improved, and the breakage resistance was excellent. Especially in Ex. 1, since MFR did not become higher during molding than in Ex. 8, the horn height was low, and the uniform stretchability was superior.

On the other hand, in Ex. 10 to 18 wherein a resin not blended was used, or even if a blend resin was used, α was less than 0.99, or MFR was less than 6 g/10 min. or at least 20 g/10 min., the films were bad in one or both of the breakage resistance and the uniform stretchability.

For example, with the film in Ex. 11 wherein non-blended ETFE was used, MFR was equivalent to in Ex. 1 and 2, but α was as low as 0.5. Also in the evaluation, the breakage resistance was bad. With the film in Ex. 10 wherein MFR was made lower than in Ex. 11 by using non-blended ETFE, since MFR was low, the strength was high, but since α was low at 0.5, elongation was poor, and the breakage resistance was bad. With the film in Ex. 12 wherein non-blended ETFE

INDUSTRIAL APPLICABILITY

Applications of the film of the present invention are not particularly limited, and, for example, a release film for the production of a semiconductor device, a film for an agricultural house, a film for a building such as a tent film, a film for a chemical storage bag, etc. may be mentioned.

The film of the present invention is excellent in elongation and strength, and excellent in breakage resistance and uniform stretchability, and thus is highly useful as a release film for the production of a semiconductor device, and it is especially useful as a release film for the production of a semiconductor device by a transfer molding method or a compression molding method.

This application is a continuation of PCT Application No. PCT/JP2017/024238, filed on Jun. 30, 2017, which is based upon and claims the benefit of priority from Japanese Patent Application No. 2016-132443 filed on Jul. 4, 2016. The contents of those applications are incorporated herein by reference in their entireties.

REFERENCE SYMBOLS

1: Release film, 10: substrate, 12: semiconductor chip, 14: resin sealing portion, 19: cured product, 40: curable resin, 50: upper mold, 52: lower mold, 54: cavity, 56: cavity surface, 58: substrate installing portion, 60: resin introduction portion, 62: resin placement portion, 64: plunger, 110: batch sealed body

What is claimed is:
1. A film being a single layer film, comprising a blend resin of two resins both belonging to any one of the following ETFE, PFA, FEP, ECTFE and PMP,
wherein the blend resin is a blend material of a resin having a melt flow rate of from 4 to 7 g/10 min. and a resin having a melt flow rate of from 20 to 50 g/10 min. wherein in the case where the resin is ETFE, the melt flow rate is measured in accordance with ASTM D3159 under a load of 49N at 297° C., in the case where the resin is PFA, the melt flow rate is measured in accordance with ASTM D1238 under a load of 49N at 372° C., in the case where the resin is FEP, the melt flow rate is measured in accordance with ASTM D1238 under a load of 49N at 372° C., in the case where the resin is ECTFE, the melt flow rate is measured in accordance with ASTM D1238 under a load of 21.168N at a temperature of 271.5° C., and in the case where the resin is PMP, the melt flow rate is measured in accordance with ASTM D1238 under a load of 49N at a temperature of 260° C.,
the melt flow rate of the film is at least 6 g/10 min. and less than 20 g/10 min., and α of the film calculated by the following Formula 1 is at least 0.99:
ETFE: a copolymer comprising tetrafluoroethylene units and ethylene units, wherein the molar ratio of tetrafluoroethylene units/ethylene units is from 60/40 to 40/60, and the proportion of units based on other monomer to the total of tetrafluoroethylene units and ethylene units is from 0 to 6 mol %,
PFA: a copolymer comprising tetrafluoroethylene units and perfluoro(alkyl vinyl ether) units, wherein the molar ratio of tetrafluoroethylene units/perfluoro(alkyl vinyl ether) units is from 99/1 to 85/15, and the proportion of units based on other monomer to the total of tetrafluoroethylene units and perfluoro(alkyl vinyl ether) units is from 0 to 5 mol %,
FEP: a copolymer comprising tetrafluoroethylene units and hexafluoropropylene units, wherein the molar ratio of tetrafluoroethylene units/hexafluoropropylene units is from 75/25 to 95/5, proportion of units based on other monomer to the total of tetrafluoroethylene units and hexafluoropropylene units is from 0 to 5 mol %,
ECTFE: a copolymer comprising chlorotrifluoroethylene units and ethylene units, wherein the molar ratio of chlorotrifluoroethylene units/ethylene units is from 60/40 to 40/60, and the proportion of units based on other monomer to the total of chlorotrifluoroethylene units and ethylene units is from 0 to 5 mol %,
PMP: a polymer comprising from 85 to 100 mol % of 4-methyl-1-pentene units and from 0 to 15 mol % of units based on at least one type of monomer selected from the group consisting of ethylene and $C_{3-20}$ α-olefins,

$$\alpha = 1 - (\Sigma(y_i - f_i)^2 / \Sigma(y_i - y_a)^2) \quad \text{Formula 1}$$

wherein $y_i$ is LN ($\eta_i$), $f_i$ is an estimated value by an approximate quadratic function, and $y_a$ is an average value of LN ($\eta_i$), wherein LN ($\eta_i$) is a natural logarithm of a complex shear viscosity $\eta_i$ of the film measured, in accordance with ISO 6721-10: 1999, with applying a sine wave of an angular frequency $\omega_i$, and
wherein the estimated value by the approximate quadratic function is an estimated value by the approximate quadratic function obtained, by at least squares method, from a graph having the natural logarithm LN ($\eta_i$) plotted on the vertical axis and a natural logarithm LN ($\omega_i$) of the angular frequency $\omega_i$ plotted on the horizontal axis.

2. The film according to claim 1, wherein between the two resins, the ratio of the melt flow rate of the resin having a melt flow rate of from 20 to 50 g/10 min. to the melt flow rate of the resin having a melt flow rate of from 4 to 7 g/10 min., is from 3 to 12.

3. The film according to claim 1, wherein each of the resins comprise tetrafluoroethylene units, ethylene units and (perfluoroalkyl)ethylene units.

4. The film according to claim 1, wherein each of the resins comprise tetrafluoroethylene units and perfluoro(alkyl vinyl ether) units.

5. The film according to claim 1, wherein each of the resins comprise tetrafluoroethylene units, hexafluoropropylene units and perfluoro(alkyl vinyl ether) units.

6. The film according to claim 1, wherein each of the resins comprise chlorotrifluoroethylene units and ethylene units.

7. The film according to claim 1, wherein each of the resins comprise 4-methyl-1-pentene units and 1-octadecene units.

8. The film according to claim 1, which is a release film for the production of a semiconductor device.

9. A method for producing a film as defined in claim 1, comprising using two resins both belonging to any one of said ETFE, PFA, FEP, ECTFE and PMP, wherein the melt flow rate of one resin is from 4 to 7 g/10 min. and the melt flow rate of the other resin is from 20 to 50 g/10 min., and blending the two of resins, followed by molding into a film-form.

10. The method for producing a film according to claim 9, wherein using an extrusion molding apparatus having a melt-kneading section provided with a screw and a cylinder that accommodates the screw, and a molding section provided with a die connected to the tip of the cylinder, the film is produced by setting the product ($\gamma \times (L_1/D)$) of the shear rate at the screw metering zone and the ratio of the length of the screw metering zone to the cylinder bore obtainable by the following formula, at the time of melt kneading the two resins, to be from 100 to 3,000 s$^{-1}$:

$$\gamma \times (L_1/D) = \pi \times L_1 \times N / (60 \times h)$$

where, $\gamma$ is the shear rate (s$^{-1}$), $L_1$ is the length (mm) of the screw metering zone, D is the cylinder bore (mm), N is the screw rotation speed (rpm), and h is the groove depth (mm) of the screw metering zone.

* * * * *